(12) United States Patent
Zanella, Sr.

(10) Patent No.: US 12,729,946 B2
(45) Date of Patent: Sep. 8, 2026

(54) MULTI-MODE THICKNESS MEASUREMENT DEVICE AND METHODS

(71) Applicant: AGR INTERNATIONAL, INC., Butler, PA (US)

(72) Inventor: Mark F. Zanella, Sr., Chicora, PA (US)

(73) Assignee: AGR INTERNATIONAL, INC., Butler, PA (US)

( * ) Notice: Subject to any disclaimer, the term of this patent is extended or adjusted under 35 U.S.C. 154(b) by 0 days.

(21) Appl. No.: 19/099,818

(22) PCT Filed: Jul. 17, 2023

(86) PCT No.: PCT/US2023/070316
§ 371 (c)(1),
(2) Date: Jan. 30, 2025

(87) PCT Pub. No.: WO2024/030726
PCT Pub. Date: Feb. 8, 2024

(65) Prior Publication Data

US 2026/0029225 A1 Jan. 29, 2026

Related U.S. Application Data

(60) Provisional application No. 63/395,554, filed on Aug. 5, 2022.

(51) Int. Cl.
*G01B 7/06* (2006.01)
*G01R 33/07* (2006.01)

(52) U.S. Cl.
CPC ................ *G01B 7/10* (2013.01); *G01B 7/08* (2013.01); *G01R 33/072* (2013.01)

(58) Field of Classification Search
CPC . G01B 7/06; G01B 7/08; G01B 7/085; G01B 7/10; G01B 7/105
See application file for complete search history.

(56) References Cited

U.S. PATENT DOCUMENTS 3,077,858 A * 2/1963 Ulug .................... G01B 7/105 324/699
4,302,721 A 11/1981 Urbanek et al.
4,553,095 A * 11/1985 Schenk, Jr. .............. G01B 7/06 324/230
5,293,132 A 3/1994 Koch
5,389,875 A * 2/1995 Rosen ................ G01R 33/0325 324/228

(Continued)

FOREIGN PATENT DOCUMENTS

CN 104006732 A 8/2014
WO 2024030726 A2 3/2024

OTHER PUBLICATIONS

International Search Report and Written Opinion for corresponding International Application No. PCT/US2023/070316, mailed Jan. 24, 2024.

(Continued)

*Primary Examiner* — Steven L Yeninas
(74) *Attorney, Agent, or Firm* — K&L Gates LLP

(57) ABSTRACT

A multi-mode thickness measurement device comprises both a magnetic thickness measurement system and a capacitive thickness measurement system at an operative end of the measurement device.

15 Claims, 4 Drawing Sheets

(56) References Cited

U.S. PATENT DOCUMENTS

| | | | | |
|---|---|---|---|---|
| 5,467,014 | A * | 11/1995 | Nix | G01B 7/105 324/230 |
| 6,586,930 | B1 * | 7/2003 | Kumar | G01B 7/10 324/225 |
| 7,180,286 | B2 * | 2/2007 | Fischer | G01B 21/08 324/230 |
| 8,248,611 | B2 | 8/2012 | Christensen et al. | |
| 8,762,103 | B2 | 6/2014 | Krucinski | |
| 2003/0090266 | A1 * | 5/2003 | Kesil | G01B 7/105 324/230 |
| 2004/0207395 | A1 * | 10/2004 | Sarfaty | G01B 7/085 324/230 |
| 2004/0239345 | A1 | 12/2004 | Amini | |
| 2006/0287602 | A1 | 12/2006 | O'Brien et al. | |
| 2009/0264756 | A1 | 10/2009 | Da Silva et al. | |
| 2017/0023353 | A1 | 1/2017 | Moed et al. | |
| 2019/0101516 | A1 * | 4/2019 | Afzal | G01B 5/06 |

OTHER PUBLICATIONS

MBT 7200/7400xt, Portable Thickness Measurement Gauges, Agr International, Inc., agrintl.com.

Magna-Mike® 8600, Precision Thickness Gage, Olympus Scientific Solutions Americas Corp.

T.O. Kim et al., Non-Contact and In-Process Measurement of Film Coating Thickness by Combining Two Principles of Eddy-Current and Capacitance Sensing, Annals of the Cirp vol. 56/Jan. 2007, pp. 509-512, Elsevier.

* cited by examiner

MULTI-MODE THICKNESS MEASUREMENT DEVICE AND METHODS

PRIORITY CLAIM

The present application is a National Stage application under 35 U.S.C. § 371 of International App. No. PCT/US2023/070316, having an International Filing Date of Jul. 17, 2023, which claims priority to U.S. provisional application Ser. No. 63/395,554, filed Aug. 5, 2022, having the same title and inventor as above, and which is incorporated herein by reference in its priority.

BACKGROUND

Manufacturers and their customers routinely measure the thickness of walls or other features of containers to ensure quality. Historically, devices of various technologies have been used for this purpose. Decades ago, thickness was measured using mechanical gauges and methods. These techniques sometimes required that the samples be cut apart to place the gauges into the proper locations. Due to this limitation, non-destructive methods were adopted. While there are many technical methods known to measure thickness, two have been highly adopted for food and beverage containers. These two sensing methods are magnetic and capacitive.

Magnetic methods use a reference target placed on the opposite side of the sample. Any non-ferrous object can be measured using this method. This method has caused great concern from users that the target will be lost or forgotten in the container before filling. Consequently, the magnetic products lack portability and are quarantined to quality labs, where the targets can be closely monitored. Magnetic methods can be highly accurate if the surrounding area is free of ferrous metals and the temperature remains stable. Magnetic probes are generally heavy and can be somewhat fragile. The MBT-7200 by ElektroPhysik and the MagnaMike-8600 by Olympus are examples of such products.

Capacitive methods do not use a reference target. Any non-conductive object of various dielectrics can be measured using capacitive methods. However, because the dielectric value of the sample may be unknown or vary across different manufacturing batches, measurement errors may result. This requires that known thickness standards are available for the sample material. A magnetic probe can be used to quickly create such standards. Capacitive probes can also be inaccurate when other surrounding conductive materials are present, as well as the operator's hands. Without the need for a target object, users find that capacitive products are highly portable. The HHTP-2000 by AGR is an example of such a product.

SUMMARY

The object of the invention is to provide a measurement device in which both magnetic and capacitive sensing technologies coexist. The multi-mode thickness measurement device is for measuring a thickness of a sample and comprises an operative end, where the operative end comprises both a magnetic thickness sensing system and a capacitive thickness sensing system. A multi-mode measurement device according to the present invention improves upon mono-technology devices both providing both magnetic and capacitive technologies in a single device, while also being, in various embodiments, portable, rugged and capable of being operated in both sensing modes.

The magnetic thickness sensing system comprises a reference target placed at the opposite side of the sample from the operative end. A user of the device could, by utilizing only the capacitive thickness-sensing mode, avoid using the target. Also, by utilizing the magnetic thickness-sensing mode, the thickness of non-magnetic samples could be measured with the device that could not be measured with the capacitive thickness sensing system (e.g., samples that are electrically conductive). Embodiments of the measurement device can also be highly portable when need be, while being constructed with highly rugged material. The device can also self-calibrate for measurement of dielectric samples.

FIGURES

Various embodiments of the present invention are described herein by way of example with the following figures.

DESCRIPTION

Figures 1, 2:
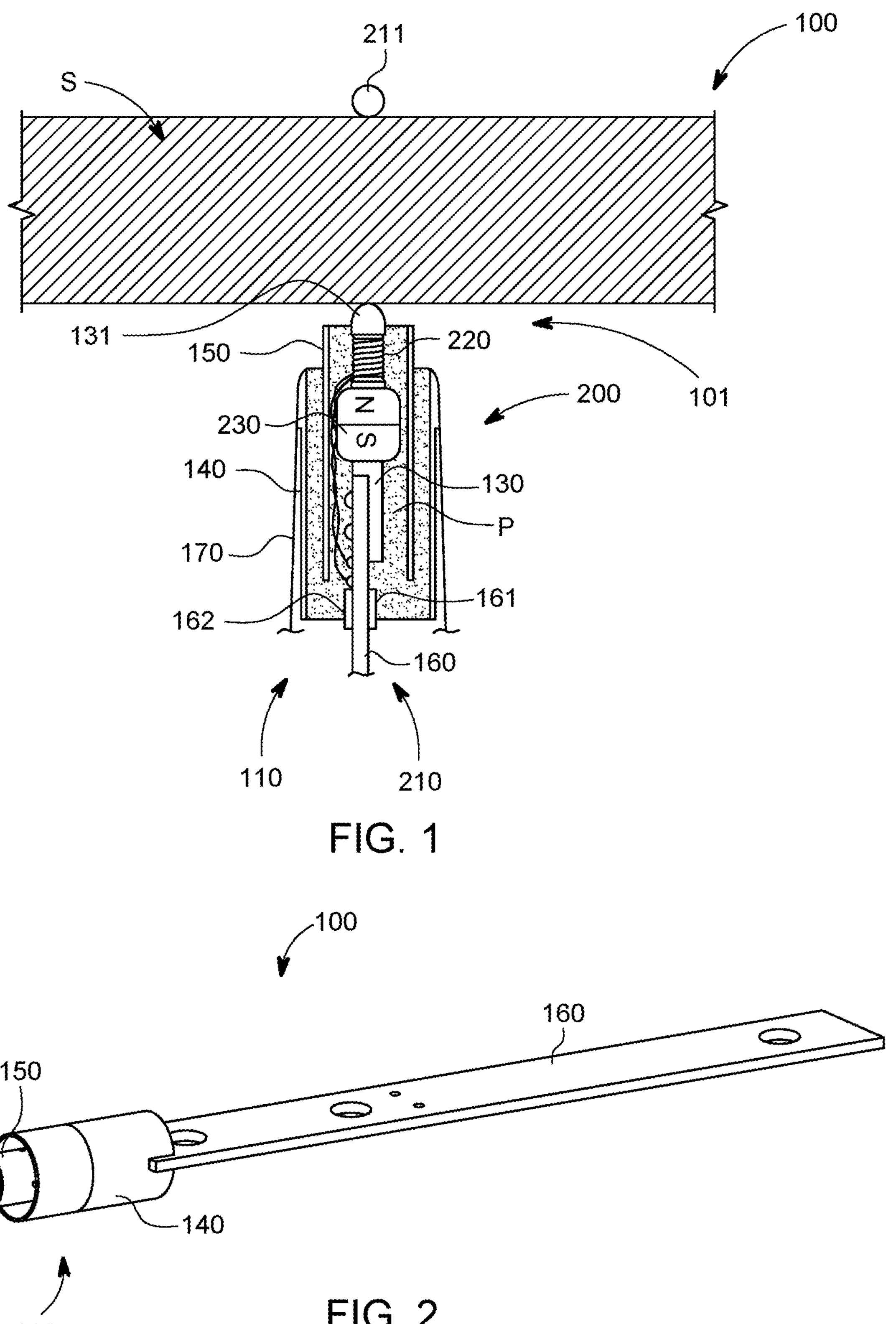
FIG. 1 is a partial cross-sectional view of an operative end of a multi-mode thickness measurement device according to various embodiments of the present invention.
FIG. 2 is a perspective view of the multi-mode thickness measurement device of FIG. 1.
Figure 3:
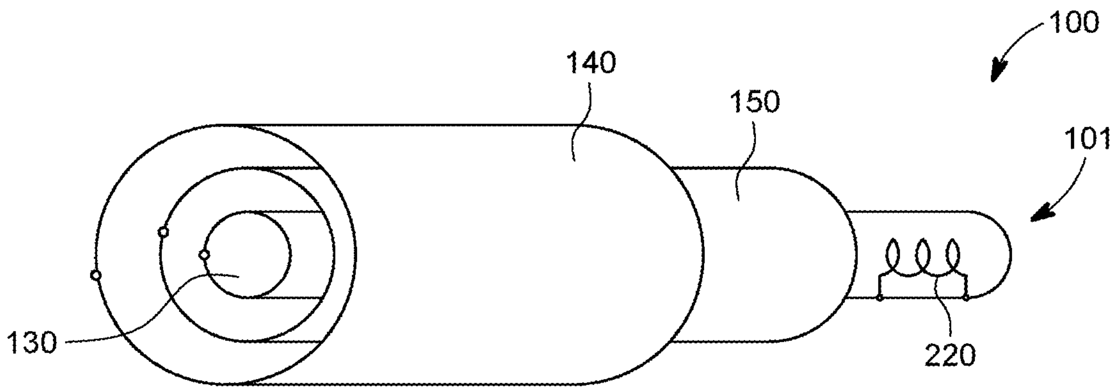
FIG. 3 is a partial perspective view of the multi-mode thickness measurement device of FIG. 1.

FIGS. 1, 2 and 3 show a multi-mode thickness measurement device 100 according to various embodiments of the present invention. The measurement device 100 measures the thickness of a sample "S" (or object) that is located between a tip 131 at an operative end 101 of the measurement device 100 on one side of the sample S and a target 211 located on the other side of the sample S.

The capacitive sensor, or capacitive sensing system, 110 is constructed using a central conductive rod 130 and concentric conductive tubes 140, 150 around the central conductive rod 130. The tubes 140, 150 act as shields for the capacitive sensor 110 as shown in FIG. 1 (inner shield 150 and outer shield 140). The diameter of the tubes/shields 140, 150 affects the measurement range of the capacitive sensor 110. The diameters of the tubes/shields 140, 150 can, therefore, be chosen to achieve a desired sample thickness range for the measurement device 100. Tubes of larger diameter will produce capacitive fields across a larger area of the sample and have a greater thickness measurement range. The diameter of the tubes 140, 150 may, for instance, be in a range of 0.25" to 1.0". The outer shield 140 has a greater diameter than the inner shield 150 and is used to focus the capacitive fields and keep the user's hands from interacting with the measurement (a user's hand may disrupt the surrounding electrical field and, thus, the capacitance of the electrical field). The gap between the inner shield 150 and the central conductive rod 130 are the measurement area for the sample thickness, where one side of the sample S is placed against the tip 131 of the central conductive rod 130.

In at least one instance, the capacitance of the electric field within the gap is measurable to determine a thickness of the sample S. When operated in the capacitive sensing mode, the central conductive rod 130 as well as the inner and outer shields 150, 140 can be the electrodes, and the capacitive IC (integrated circuit) 161 can measure the capacitance between any two electrodes, which is affected by the presence of the sample S. In particular, the sample thickness increases the measured capacitance between the electrodes, and the capacitive IC 161 can compute a thickness for the sample S based on the measured capacitance between the electrodes and a known or estimated dielectric value for the sample S. For the capacitive sensing mode, the sample S needs to be non-conductive. Driving the inner shield 150 and the outer shield 140 with opposite voltage polarities reduces the closeness of the operator's hand from influencing the measurements. Driving the shields 140, 150 with the same voltage polarity allows the system measure how close the operator's hand is to the sensing tip 131, which can be used to provide a warning to the operator.

Coexisting with the capacitive sensor 110 at the operative end 101 of the measurement device 100 is a magnetic sensing system 200, which also utilizes the ferrous or magnetic target 211 on the opposite side of the sample S from the rod tip 131. The central conductive rod 130 acts as the magnetic core 210 of the magnetic sensing system 200. The rod 130 can be made of any ferrous metal or suitable magnetic material. Examples would be Iron, Nickel or Invar or preferably something from the 400 series stainless steel family for durability and corrosion resistance. The size and type of the target 211 (e.g., a ball) can be used to extend sensing range. The target ball 211 can be made from any ferrous material, or preferably any magnetic material (such as neodymium). It can also be appreciated that the target 211 does not need to be a ball, but any suitable magnetic reference material, such as a wire or plate or even a larger suitable object. The target 211 (e.g., ball) could be tethered on a Kevlar string for easy retrieval from inside the object or to prevent it from being lost.

The sensing element for the magnetic system could be a Hall effect sensor or a coil. If a coil is used, the wire can be a diamagnetic wire such as copper or a paramagnetic wire such as platinum. As shown in FIG. 1, the insulated coil wire 220 could be wrapped around the rod 130 (or with an insulator in between). Note that in FIG. 3 the coil 220 is shown schematically rather than being wrapped around the rod 130 near the tip 131. The measurement device 100 may also preferably comprise a permanent magnet 230 surrounding the rod 130 to magnetize the rod 130 for low power operation, or could also be supplied from another coil. From the current induced by the coil 220, or from the output of the Hall effect sensor which would be affixed to the side of the rod (see FIG. 6, for example), as the case may be, a magnetic IC (integrated circuit) 162 (connected to the circuit board 160) can compute a strength of the magnetic field between the rod 130 and the target 211, which is based on the thickness of the sample S. The distance from the end of the tip 131 of the rod 130 to the target 211 would be relationally related to changes in magnetic field strength and thus sample thickness. The magnetic system 200 can measure the thickness of conductive non-ferrous metals, such as brass or aluminum, or non-conductive materials such as glass or plastic.

The integrated circuits described herein can comprise any suitable integrated circuits. For example, the inductive-sensing integrated circuit can comprise a circuit configured to measure the strength of a magnetic field. The measured magnetic field strength can be converted to a thickness measurement. The capacitive-sensing integrated circuit can comprise a circuit configured to measure the capacitance of the gap between the electrodes varied by the sample S. The measured capacitance can be converted to a thickness measurement.

As shown in the diagrams, the measurement device 100 may extend along the length of the rod 130 and/or the circuit board 160. The longitudinally extending measurement device 100 comprises the above-described tip 131 at the operative end 101 thereof. The other end of the device 100 may comprise a user control where a user can control operation of the device, such as select the capacitive mode and/or the magnetic mode. In that connection, the measurement device 100 can be a handheld device that a person can easily hold in one hand. The device also preferably includes a display for displaying the computed measurement of the sample S. The device could also include, or be in communication with, a remote computer device 320 for additional operability and ease of use. The remote computer device 320 may comprise a mobile device, such as smartphone, tablet computer, or wearable computer (such as a smartwatch), or it could comprise, for example, a PC, laptop or computer-based test equipment. The measurement device 100 may be in communication with the remote computer device 320 via a wired (e.g., USB) or wireless data link (e.g., Bluetooth, WiFi, Zigbee, etc). The remote computer device 320 may also include a display (not shown) for showing the results of measurements by the measurement device 100 and for otherwise displaying information and/or settings for the measurement device 100 that is useful to the user of the measurement device 100. For example, the remote computer device 320 may be mobile device with a mobile application installed thereon, and run by a processor the remote computer device 320, wherein the mobile application is designed to communicate (e.g., through Bluetooth) with the measurement device.

The above-described device 100 allows the multi-mode thickness measurement device to be miniaturized without losing measurement range with respect to undriven systems. Miniaturizing the design allows the device 100 to be less prone to errors associated with variations in sample curvature. Thin materials (e.g., less than 1 mm) can be accurately measured regardless of sample shape. In at least one instance, the device 100 is battery powered and/or corded, for example, to energize various components of the device.

The capacitive sensing mode of the device 100 could operate with or without the target 211 at the other side of the sample S. If the target 211 is in position on the other side of the sample S when the capacitive sensing mode is used, the effect of the target 211 on the sensed capacitance should be accounted for. In at least one instance, a control circuit is provided which is configured to detect whether or not the target is in position on the other side of the sample S and, if the target is in position on the other side of the sample S, automatically adjust a capacitive measurement algorithm to account for the presence of the sample S. In at least one instance, the control circuit is configured to alert a user to remove the target 211 upon detecting its presence prior to taking a capacitive measurement.

The multi-mode measurement device 100 could be arranged or constructed in many ways depending on the desired requirements. To enhance durability, the various components of the device 100 may be constructed from durable materials. The centrally conductive rod 130 could be attached to the circuit board 160 with fasteners and the abutted edges of the circuit board 160 and its components are arranged so impacts will not cause electrical faults. The concentric metal tubes 140, 150 may be interdigitated with the circuit board 160 and may be joined in multiple locations. Once assembled, the inner spaces are filled with a potting P for increased durability. An outer housing 170 may support the overall sensor assembly (such as the capacitive sensing system and the magnetic sensing system and associated components, for example) and impact resistant features within the housing 170 can further enhance the durability of the device. Also, the sensing tip 131 and/or the conductive rod 130 is preferably designed to be positioned along the centerline of the instrument to tolerate high impacts, thereby improving reliability and durability.

Once assembled, the multi-mode measurement device 100 lends itself well to performance enhancements. With the magnetic sensing system 200 cohabitating within the capacitive sensing system 110, the magnetic sensing system 200 can be used to create calibration reference standards for the capacitive system 110 to address the many dielectrics encountered. That is, for example, the magnetic sensing system 200 could be calibrated on any known mechanical thickness. The capacitive system 110 can be calibrated on a known thickness of the target dielectric/sample (such as the sample S, for example), which the thickness of the target dielectric/sample could be measured by the device's magnetic sensing system 200. In at least one instance, a control circuit is configured to determine the thickness of a sample based on the thickness measurement of the sample from the capacitive sensing system 110 and a thickness measurement of the sample from the magnetic sensing system 200.

Figure 4:
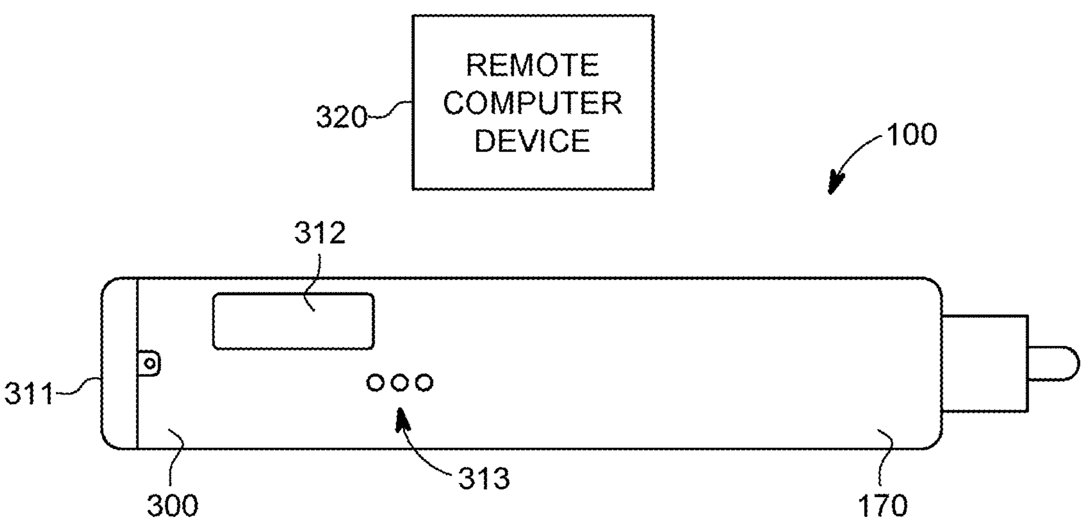
FIG. 4 is an elevational view of the multi-mode thickness measurement device of FIG. 1, wherein the measurement device comprises a handheld body portion.

As can be seen in FIG. 4, the measurement device 100 further comprises a handheld body portion 300. The housing 170 is integral with the handheld body portion 300. The handheld body portion 300 comprises a replaceable battery pack 311 to power one or more components of the measurement device 100, a display 312 configured to display measurements, alerts, and/or calibration instructions, for example, and actuatable control buttons 313 configured to operate the measurement device 100. In at least one instance, the control buttons 313 comprise a control button for activating/deactivating the capacitive sensing system 110, a control button for activating/deactivating the magnetic sensing system 200, and a control button for calibrating the measurement device 100. In at least one instance, the control buttons 313 further comprise general navigation buttons to navigate through various menus and/or selectable operational states on the display 312.

Figure 5:
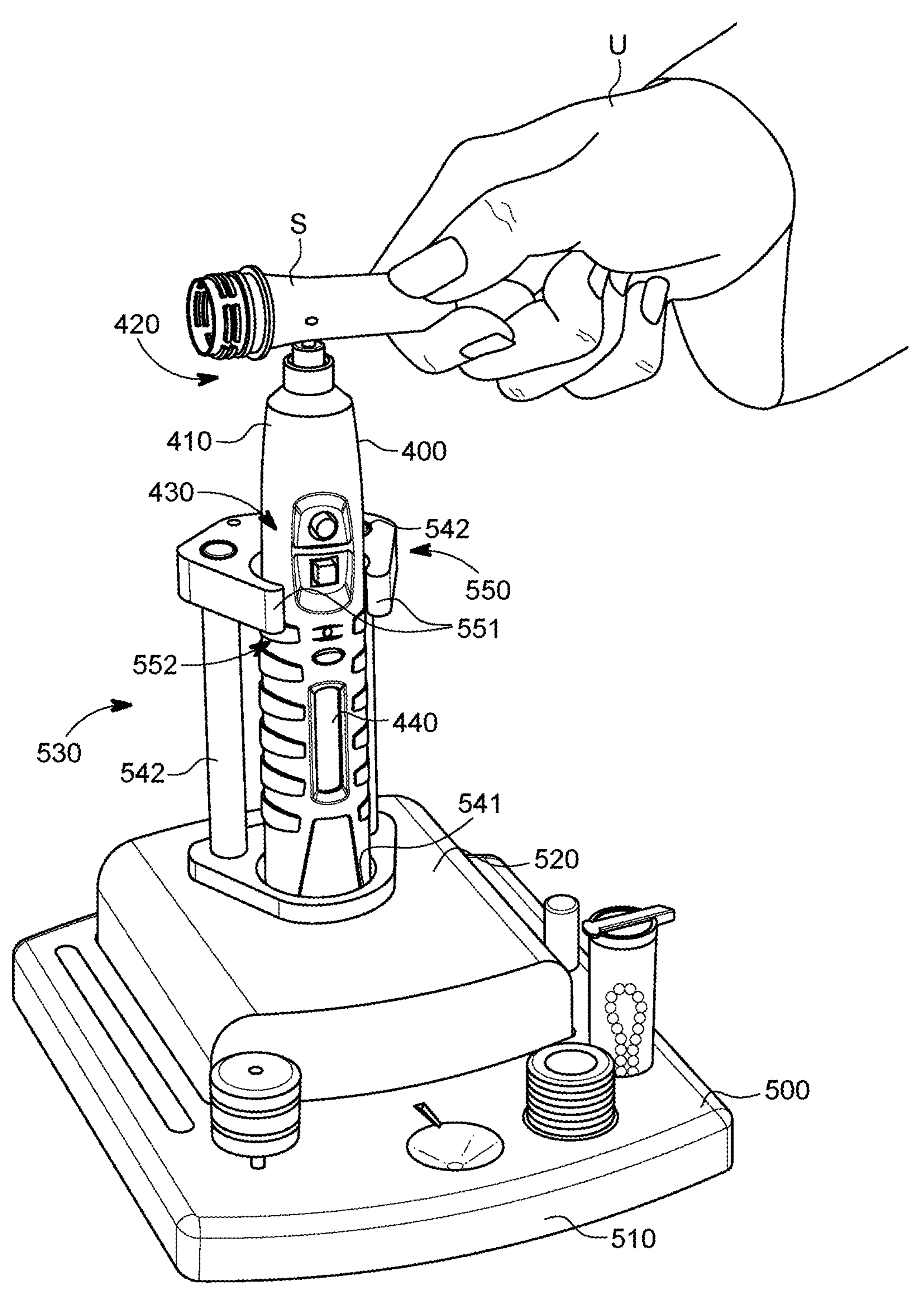
FIG. 5 is a view of the measurement device according to other embodiments of the present invention.

FIG. 5 depicts a multi-mode measurement device 400 and a stand assembly 500 configured to support the multi-mode measurement device 400 during use. The multi-mode measurement device 400 may be similar to the measurement device 100 in many respects and details thereof will not be repeated for the sake of brevity. The multi-mode measurement device 400 includes a magnetic thickness-sensing mode and a capacitive thickness-sensing mode. The multi-mode measurement device 400 comprises a housing 410 configured to house the internal components of the measurement device 400 and an operative end 420 against which a sample "S" is configured to be positioned. The multi-mode measurement device 400 further comprises a control interface, or buttons, 430 (such as power buttons, selector buttons, mode buttons, and/or screen brightness buttons, for example), and a display 440 configured to display measurements, selected mode, battery life, and/or calibration settings, for example. As discussed herein, the multi-mode measurement devices disclosed herein can be handheld. In at least one instance, as shown in FIG. 5, the multi-mode measurement device 500 is also configured to be operable in an upright, supported position supported by a support base 500

As can be seen in FIG. 5, the support base 500 is configured to hold the measurement device 500 in a standing, upright position so that a user "U" may hold the sample S against the operative end 420 of the measurement device 400 to obtain a measurement without the user U physically holding the measurement device 400. The support base 500 comprises a base portion 510 and a holding frame 530 configured to hold and support the measurement device 400 during use. The holding frame 530 comprises a secondary base 520 supported by the base portion 510. The holding frame 530 further comprises a detent 541 defined in the secondary base 520 within which the bottom of the housing 410 is configured to rest. The holding frame 530 further comprises support posts, or pins, 542 and an upper holding portion 550 supported by the support posts 542. The support posts 542 are mounted to and supported by the secondary base 520. The upper holding portion 550 comprises holding arms 551 configured to hold and/or support the measurement device 400 during use. The upper holding portion 550 and arms 551 may be comprised of a flexible material, for example, so as to permit the opening of the arms 551 upon placing the measurement device 400 into the support base 500 such that the arms 551 flex back into a holding position after the measurement device 400 is placed sufficiently into an aperture 552 defined in the upper holding portion 550. At this point, the user U may place the sample S against the operative end 420 of the measurement device 400 to obtain a measurement of the sample S.

Figure 6:
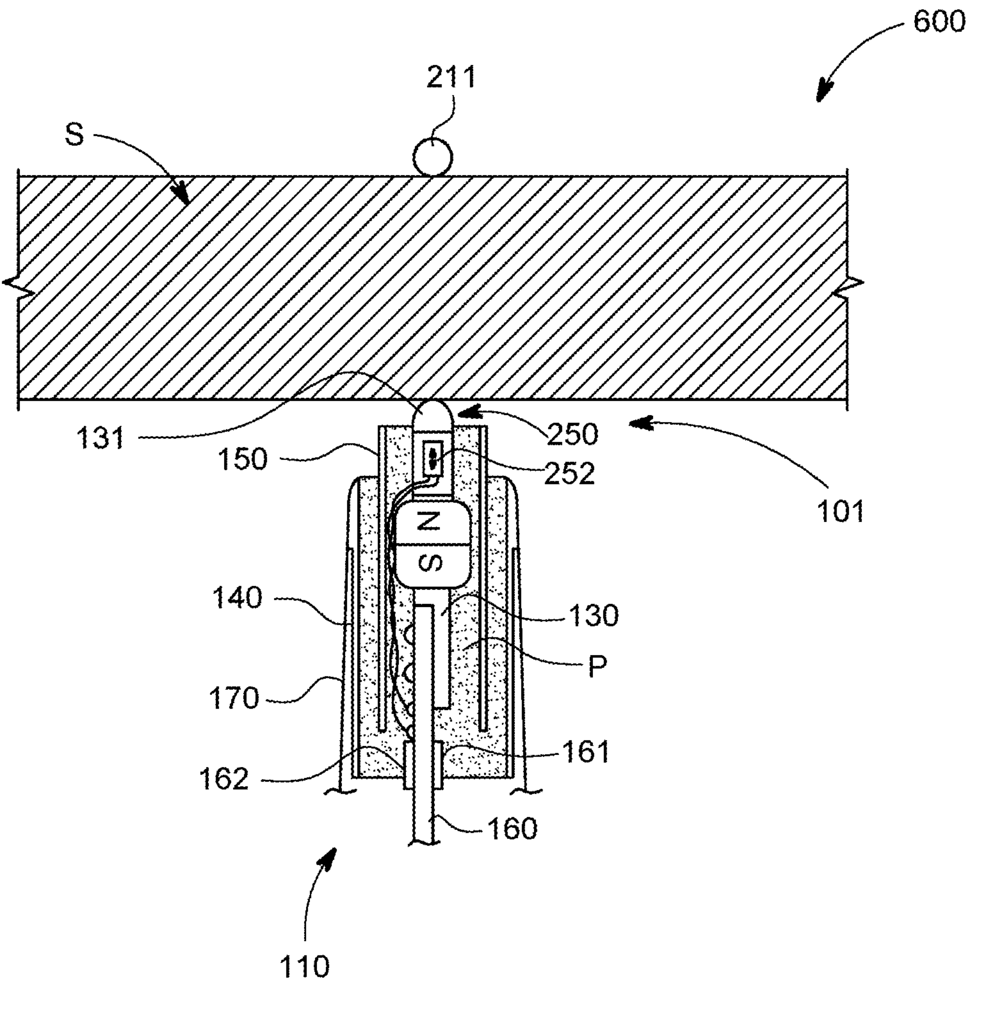
FIG. 6 is a partial cross-sectional view of an operative end of a multi-mode thickness measurement device comprising a Hall effect sensor according to various embodiments of the present invention.

FIG. 6 depicts a multi-mode thickness measurement device 600. The multi-mode thickness measurement device 600 is similar in many respects to the other devices disclosed herein except for the differences noted below. The multi-mode thickness measurement device 600 comprises a capacitive thickness-sensing system 110 and a magnetic thickness-sensing system 250 comprising a Hall effect sensor 252 mounted to the conductive rod 130. The multi-mode thickness measurement device 600 employs the Hall effect sensor 252 (instead of a coil 220 like the measurement device 100) as a magnetic sensing element to sense a magnetic field. Using the target 211 to alter the magnetic field, the thickness of the sample S can be determined by detecting the strength of the magnetic field with the Hall effect sensor 252.

The examples presented herein are intended to illustrate potential and specific implementations of the present invention. It can be appreciated that the examples are intended primarily for purposes of illustration of the invention for those skilled in the art. No particular aspect or aspects of the examples are necessarily intended to limit the scope of the present invention. Further, it is to be understood that the figures and descriptions of the present invention have been simplified to illustrate elements that are relevant for a clear understanding of the present invention, while eliminating, for purposes of clarity, other elements. While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

What is claimed is:

1. A multi-mode thickness measurement device for measuring a thickness of a sample, the measurement device comprising an operative end and a body defining a longitudinal axis, wherein the operative end comprises:

a magnetic thickness sensing system; and a capacitive thickness sensing system, and wherein the operative end extends from the body along the longitudinal axis, wherein the sample being measured by the measurement device is to be placed against the operative end such that the thickness of the sample along the longitudinal axis is measured, wherein the body comprises a handheld body portion, wherein the operative end is at a distal end of the handheld body portion, wherein the measurement device further comprises a circuit board comprising a capacitive-sensing integrated circuit and a magnetic-sensing integrated circuit, wherein the capacitive thickness sensing system comprises a conductive inner tube and a conductive outer tube, wherein the conductive inner tube and the conductive outer tube are concentric, and wherein the circuit board is positioned centrally with respect to the conductive inner tube and the conductive outer tube.

2. The multi-mode thickness measurement device of claim 1, wherein the handheld body portion comprises a display, control buttons, and a replaceable battery pack.

3. The multi-mode thickness measurement device of claim 1, further comprising a magnetic target, wherein the operative end is for placement at a first side of the sample and the magnetic target is for placement at a second, opposite side of the sample, wherein the multi-mode thickness measurement device is for measuring the thickness of the sample from the first side to the second side.

4. The multi-mode thickness measurement device of claim 1, wherein the magnetic thickness sensing system comprises a Hall effect sensor.

5. A multi-mode thickness measurement device for measuring a thickness of a sample, the measurement device comprising an operative end and a body defining a longitudinal axis, wherein the operative end comprises:

a magnetic thickness sensing system; and a capacitive thickness sensing system, and wherein the operative end extends from the body along the longitudinal axis, wherein the sample being measured by the measurement device is to be placed against the operative end such that the thickness of the sample along the longitudinal axis is measured, wherein the body comprises a handheld body portion, wherein the operative end is at a distal end of the handheld body portion, wherein the measurement device further comprises a circuit board comprising a capacitive-sensing integrated circuit and a magnetic-sensing integrated circuit, wherein the capacitive thickness sensing system comprises a conductive rod, and wherein the circuit board is attached to the conductive rod.

6. The multi-mode thickness measurement device of claim 5, wherein the handheld body portion comprises a display, control buttons, and a replaceable battery pack.

7. The multi-mode thickness measurement device of claim 5, further comprising a magnetic target, wherein the operative end is for placement at a first side of the sample and the magnetic target is for placement at a second, opposite side of the sample, wherein the multi-mode thickness measurement device is for measuring the thickness of the sample from the first side to the second side.

8. The multi-mode thickness measurement device of claim 5, wherein the capacitive thickness sensing system comprises a conductive rod, and wherein the magnetic thickness sensing system comprises a wire coil wrapped around the conductive rod.

9. The multi-mode thickness measurement device of claim 8, wherein the magnetic thickness sensing system further comprises a permanent magnet positioned proximal to the wire coil and a magnetic target.

10. The multi-mode thickness measurement device of claim 8, wherein the magnetic thickness sensing system further comprises an electrical insulator between the wire coil and the conductive rod.

11. The multi-mode thickness measurement device of claim 5, wherein the magnetic thickness sensing system comprises a Hall effect sensor.

12. A multi-mode thickness measurement device, comprising: a housing; an outer conductive tube positioned within the housing; an inner conductive tube positioned within the outer conductive tube, a central conductive rod positioned within the inner conductive tube; a magnetic sensing element positioned at a distal end of the central conductive rod; and a circuit board attached to the central conductive rod, wherein the circuit board comprises a capacitive-sensing integrated circuit electrically coupled with the outer conductive tube, the inner conductive tube, and the central conductive rod, and an inductive-sensing integrated circuit electrically coupled with the magnetic sensing element.

13. The multi-mode thickness measurement device of claim 12, wherein the magnetic sensing element is shielded by the inner conductive tube.

14. The multi-mode thickness measurement device of claim 12, wherein the magnetic sensing element comprises one of a sensing coil or a Hall effect sensor.

15. The multi-mode thickness measurement device of claim 12, further comprising potting positioned between the inner conductive tube and the central conductive rod.

* * * * *